(12) United States Patent
Hellbrück et al.

(10) Patent No.: US 6,431,259 B2
(45) Date of Patent: Aug. 13, 2002

(54) SPRING CLIP FOR FIXING SEMICONDUCTOR MODULES TO A HEAT SINK

(75) Inventors: Horst Hellbrück; Ralf Jörke, both of Warstein; Konstantin Kanelis, München; Manfred Loddenkötter, Ibbenbühren; Thilo Stolze, Arnsberg, all of (DE)

(73) Assignee: Eupec Europaeische Gesellschaft fuer Leistungshalbleiter MbH & Co. KG, Warstein-Belecke (DE)

( * ) Notice: Subject to any disclaimer, the term of this patent is extended or adjusted under 35 U.S.C. 154(b) by 0 days.

(21) Appl. No.: 09/793,352

(22) Filed: Feb. 26, 2001

(30) Foreign Application Priority Data

Feb. 24, 2000 (DE) .......................... 100 08 571

(51) Int. Cl.[7] .............................. F28F 7/00; H01L 23/34; H05K 7/20
(52) U.S. Cl. ..................... 165/80.3; 165/185; 165/80.2; 257/719; 361/709
(58) Field of Search ............................... 165/80.3, 185, 165/80.2; 257/718, 719; 361/709, 704

(56) References Cited

U.S. PATENT DOCUMENTS

| | | | |
|---|---|---|---|
| 4,716,494 A | * 12/1987 | Bright et al. ............... 165/80.3 |
| 5,099,550 A | 3/1992 | Beane et al. | |
| 5,343,362 A | * 8/1994 | Solberg ...................... 165/80.3 |
| 5,357,404 A | * 10/1994 | Bright et al. ................ 257/718 |
| 5,371,652 A | * 12/1994 | Clemens et al. ............. 361/704 |
| 5,436,798 A | * 7/1995 | Wieland, Jr. ................ 165/80.3 |
| 5,464,054 A | * 11/1995 | Hinshaw et al. ........... 165/80.3 |
| 5,621,244 A | * 4/1997 | Lin ............................. 257/718 |
| 5,804,875 A | * 9/1998 | Remsburg et al. .......... 257/718 |
| 5,909,358 A | * 6/1999 | Bradt ......................... 361/707 |

FOREIGN PATENT DOCUMENTS

| EP | 0 295 387 A2 | 12/1988 |
| EP | 0 619 605 A1 | 10/1994 |
| JP | 07 183 435 A | 7/1995 |

* cited by examiner

*Primary Examiner*—Henry Bennett
*Assistant Examiner*—Tho V Duong
(74) *Attorney, Agent, or Firm*—Laurence A. Greenberg; Werner H. Stemer; Ralph E. Locher

(57) ABSTRACT

In order to fix a semiconductor module to a heat sink, the semiconductor module and the heat sink are clamped together by one or more clips made of spring material, i.e. spring clips. A mutually matched form of the spring clips optimizes the connection between the heat sink and the semiconductor modules. A respective connection of clip body and heat sink or semiconductor module is advantageously effective in such a way that the spring clip can be inserted into a respective spring clip receptacle and holds automatically on/in the heat sink or semiconductor module.

6 Claims, 7 Drawing Sheets

SPRING CLIP FOR FIXING SEMICONDUCTOR MODULES TO A HEAT SINK

BACKGROUND OF THE INVENTION

Field of the Invention

The invention relates to the fixing of semiconductor modules, in particular power semiconductor modules, e.g. IGBT modules, to a heat sink. Power semiconductor modules are technically constructed by soldering electronic components onto ceramic substrates that are usually (optionally) soldered onto a base plate that serves as a heat sink. In order to operate a power semiconductor module, the heat produced in the components must be reliably dissipated. Because the optional base plate is usually inadequate for that purpose, the semiconductor module is generally flanged onto a heat sink, or screwed to the latter, by the substrate or base plate at the side.

In order to ensure reliable heat transfer, during assembly thermally conductive paste or foil is usually introduced between the two contact areas, i.e. between the heat sink and the substrate or the base plate, in order to compensate for undulations and roughness. Because the connection looses strength upon heating, the contact thermal resistance increases. Strength is lost as a result of an increase in the amount of settling as a result of the reduced viscosity of the thermally conductive paste and/or foil, or, in the case of phase change materials, changes from the solid state to a soft (liquid) state. For this reason, after heating, retensioning of the screw joint or an additional arrangement of spring rings in the case of the screw joint is recommendable.

For this reason, the additional assembly outlay of a screw connection and, in the case of inexpensive components, the joint increases the assembly costs. These additional costs occur even without the additional outlay of retensioning that is required after operational start-up.

SUMMARY OF THE INVENTION

It is accordingly an object of the invention to provide a spring clip for fixing semiconductor modules to a heat sink that overcomes the hereinafore-mentioned disadvantages of the heretofore-known devices of the general type and that produces a cost-effective, simple and reliable connection between a semiconductor module and a heat sink.

With the foregoing and other objects in view, there is provided, in accordance with the invention, a heat sink assembly for at least one semiconductor module. The heat sink assembly includes a heat sink formed with a spring clip receptacle. A spring clip holds a semiconductor module on the heat sink. The spring clip engages the spring clip receptacle.

With the objects of the invention in view, there is also provided a semiconductor module assembly for fixing to a heat sink. The semiconductor module is formed with a second spring clip receptacle. A spring clip holds the semiconductor module on a heat sink. The spring clip engages the semiconductor module.

The generic semiconductor module also can be fixed to a generic spring clip for fixing a heat sink that is not configured according to the invention.

The generic semiconductor module also can be configured according to the invention to a semiconductor module that is not configured according to the invention.

With the objects of the invention in view, there is also provided a spring clip for fixing a heat sink to a semiconductor module. The spring clip includes a side engaging a spring clip receptacle for automatic holding of a semiconductor module and a heat sink.

According to the invention, one or more clips made of spring material, i.e. spring clips, clamp the semiconductor module onto the heat sink. The heat sink may, as an extruded profile, already have the desired form that the heat sink requires to receive a clip without additional reworking of the heat sink being necessary. The connection is more favorable than a screw joint because assembly can be completed more simply and more rapidly. Furthermore, given a sufficient pretensioning distance, such a spring clip compensates for the amount of settling between heat sink and semiconductor module, so that a reliable heat transfer can be permanently ensured without retensioning or other assembly steps that are necessary after initial operation or during operation. The clips always ensure that the desired tensioning force is provided. The spring clips have a simple form and may be composed of an elastic material, preferably spring steel.

According to the invention, a mutually matched form of the clips and heat sinks or semiconductor modules advantageously optimizes the efficient fixing. In this case, the clip and heat sink or semiconductor module can be connected by inserting or latching into place the clip and automatically holding on/in the heat sink or semiconductor module. The connection can be made even when the spring clip is not in the tensioned state in which the semiconductor module is connected to the heat sink with the spring clip.

According to one embodiment variant of the invention, the heat sink or the semiconductor module has, for this purpose, a groove over the entire length or at least in the region of a spring clip receptacle in which the spring clip is fixed to the heat sink or semiconductor module. As an alternative, instead of a groove, the heat sink or the semiconductor module also may have a collar. The collar can hold a spring clip, which in turn can be latched into place.

Furthermore, according to a further advantageous embodiment, the spring clip is shaped in such a way that the semiconductor module or the heat sink, without additional lateral forces, latches into place itself solely by an assembly force acting in one direction. As a result, a simple fixing of a plurality of semiconductor modules on a heat sink or a plurality of heat sinks on a semiconductor module over the entire length can be produced.

According to another advantageous embodiment, the housing of the semiconductor module acquires, as early as in the casting process, a suitable basin for latching in the spring clip. The basin preferably has a curb. This does not additionally increase the costs. A spring clip then can be inserted automatically into the basin, e.g. before the printed circuit board is soldered above it because doing so would make the arrangement of the clip more difficult. Preferably, a semiconductor module acquires at least two basins provided on opposite sides. Furthermore, a plurality of spring clips can be inserted into a basin or, instead of a basin-shaped spring clip receptacle, a differently shaped receptacle may be provided, e.g. a step-shaped receptacle. After the semiconductor module has been placed onto the heat sink, the suitably shaped clips can be latched, with the aid of a tool, e.g. specially shaped tongs, with high reliability and accuracy, preferably in an automated manner, into grooves provided therefor in the heat sink. If the semiconductor module is already soldered to a circuit carrier, then this latching operation can be performed without difficulty only from the side. A spring clip matched to this embodiment preferably has three bending edges, and it rocks about the first bending edge during the latching operation, and a tensioning arc is produced about the second and third bending edges. The clamping can be effected at an optional fourth bending edge.

Other features that are considered as characteristic for the invention are set forth in the appended claims.

Although the invention is illustrated and described herein as embodied in a spring clip fixing semiconductor modules to a heat sink, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6b is a plan view of the sheet used to form the spring clip shown in FIG. 6a;

FIG. 7b is a front view of the housing shown in FIG. 7a.

DESCRIPTION OF THE PREFERRED EMBODIMENTS

Figure 1:
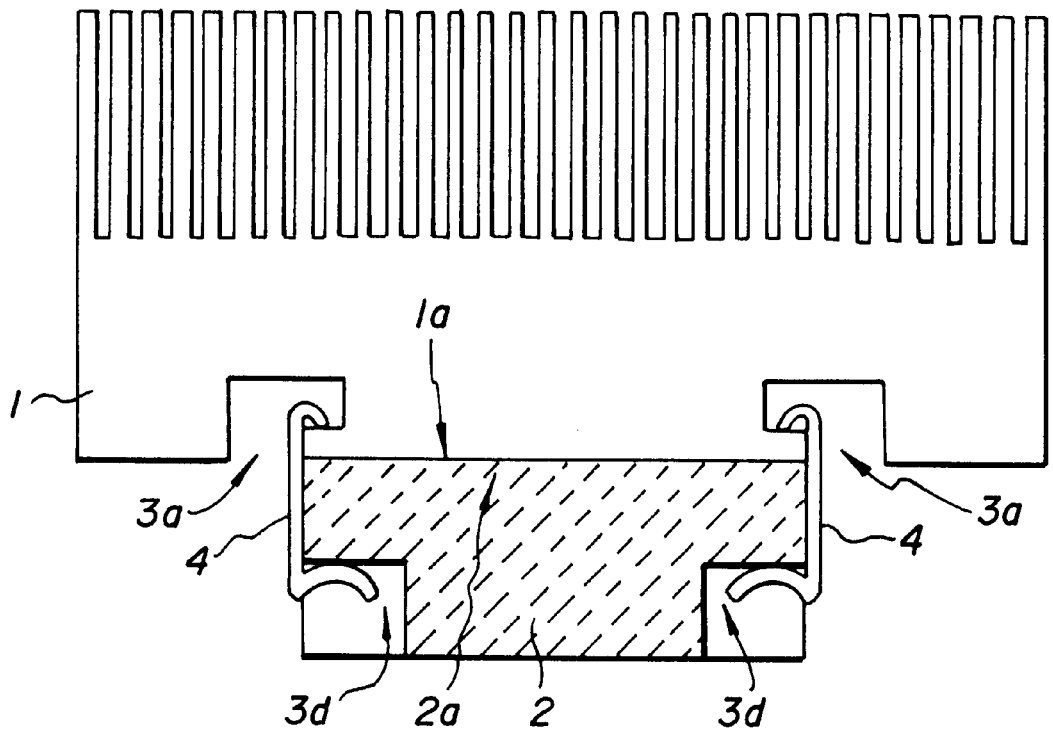
FIG. 1 is a front view of a semiconductor module/heat sink fixing in accordance with a first preferred embodiment of the invention.

In all the figures of the drawing, sub-features and integral parts that correspond to one another bear the same reference symbol in each case.

Referring now to the figures of the drawings in detail and first, particularly to FIG. 1 thereof, there is shown, in the top part, a heat sink 1 with a semiconductor module 2. The module 2 is fixed to the heat sink 1. The semiconductor module 2 bears with a bearing side 2a on a bearing area 1a of the heat sink 1. The bearing area 1a is provided on the heat sink 1, and is clamped to the heat sink 1 by two spring clips 4. For this purpose, two open grooves are provided as spring clip receptacles 3a in the heat sink 1. On account of their widening into the heat sink, the grooves enable an engaging-behind process of a respective spring clip 4 with respect to the press-on direction of the semiconductor module 2 onto the heat sink 1. For the engaging-behind process, a spring clip 4 in each case has an end region that is adapted to the respective spring clip receptacle 3a. The end region is hooked behind on an area of the spring clip receptacle 3a that lies in a region of the spring clip receptacle 3a that partly undercuts the bearing area 1a of the heat sink 1 provided for the semiconductor module 2. The respective spring clip 4 hooks itself behind in the respective spring clip receptacle 3a in such a way that it is fixedly held in a tensile direction perpendicularly on the bearing area 1a of the heat sink 1.

The semiconductor module 2 has a respective second spring clip receptacle 3d. The respective other side of a spring clip 4 engages in such a way that the semiconductor module 2 is held on the bearing area 1a of the heat sink 1 and is pressed onto the bearing area 1a. The second spring clip receptacle 3d includes a shoulder. The shoulder is provided on that side of the semiconductor module 2 that is opposite to the bearing side 2a of the semiconductor module 2 on the heat sink 1. The shoulder is provided either only in the region provided for a respective spring clip 4 or over the entire length of the semiconductor module 2.

A respective spring clip 4 creates a force action in one direction perpendicularly on the bearing area 1a of the heat sink 1. For more uniform force distribution, more than one spring clip 4 can be included. Each additional spring clip 4 has respective first and second spring clip receptacles 3a and 3d, e.g., as in the case shown in FIG. 1, two spring clips 4 respectively configured on opposite edges of the bearing area 1a of the heat sink 1. However, more than two spring clips 4 can be provided, e.g. one on each free side of the semiconductor module 2 that is situated perpendicularly to the bearing side 2a of the semiconductor module 2.

Figure 1A:
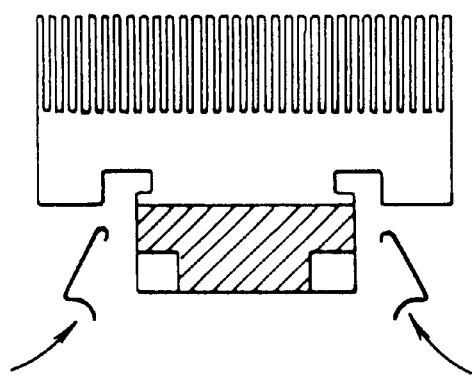
FIGS. 1a, 1b, and 1c are front views showing the formation of the first embodiment of semiconductor module/heat sink shown in FIG. 1.
Figure 1B:
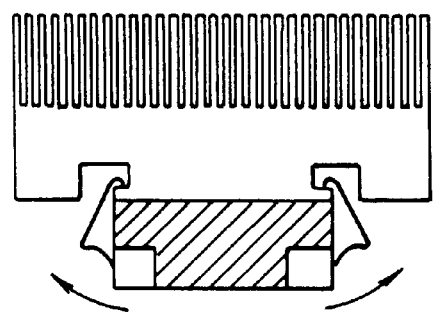
Figure 1C:
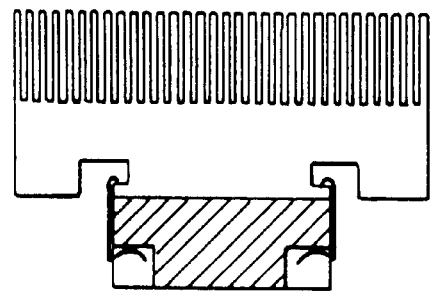

FIGS. 1a–1c show, in three steps, how the assembled state shown in the top part of FIG. 1, i.e. a semiconductor module 2 fixed according to the invention to a heat sink 1 according to the invention, is achieved according to the invention. In a first step shown by FIG. 1a, the semiconductor module 2 is placed by its bearing side 2a onto the bearing area 1a —provided therefor—of the heat sink 1 and the spring clips 4 are hung by one side into the first clip receptacles 3a of the heat sink 1. In this step, a thermally conductive paste and/or foil may also be introduced between the two contact areas.

In a second step shown in FIG. 1b, the free sides of the spring clips 4 are placed in the respective second spring clip receptacles 3d of the semiconductor module 2 by latching operations, i.e. movement toward said semiconductor module, indicated by arrows. By virtue of the spring action of the two spring clips 4, the semiconductor module 2 is connected to the heat sink 1 and pressed onto the latter. The sides of the spring clips 4 are free after the spring clips 4 have been hung into the first spring clip receptacles 3a of the heat sink 1. During the process of latching into the second spring clip receptacles 3d of the semiconductor module 2, the sides of the spring clips 4 do not have to be spread open, i.e. have applied to them lateral forces in addition to the latching force.

FIG. 1c shows the end state—also shown in FIG. 1—after assembly, i.e. after the latching-in of the spring clips 4 on the semiconductor module 2.

Such assembly is also possible with a semiconductor module 2 that has already been mounted onto a printed circuit board by the side remote from the heat sink 1.

Figure 2:
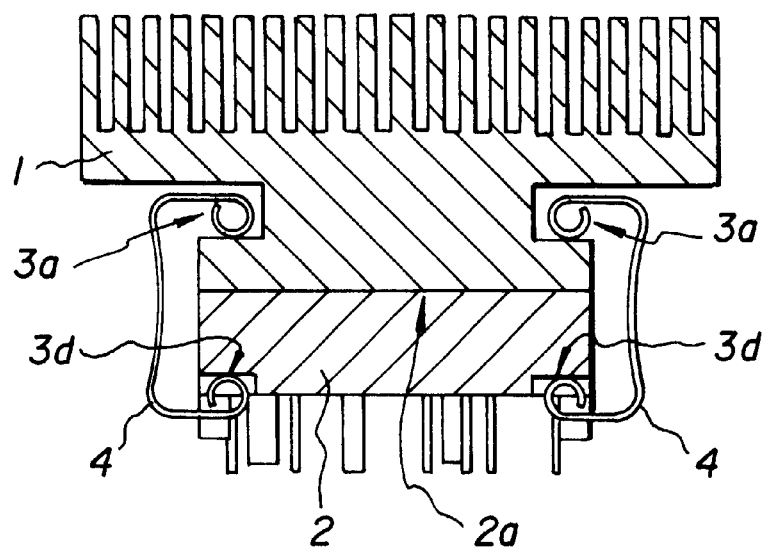
FIG. 2 is a front view of a semiconductor module/heat sink fixing in accordance with a second preferred embodiment of the invention.
Figure 2A:
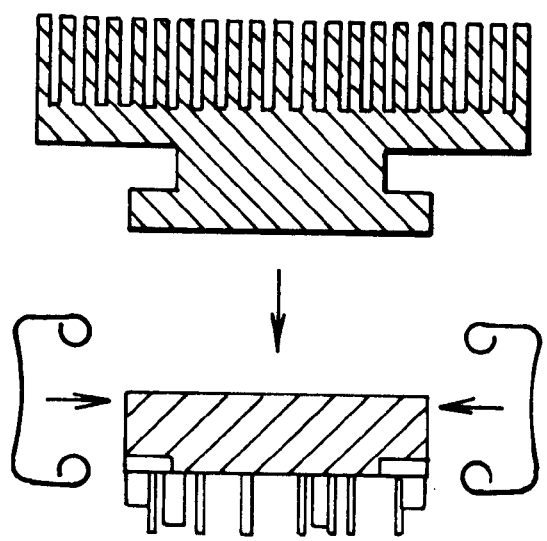
FIG. 2a and 2b show the formation of the second embodiment of semiconductor module/heat sink fixing shown in FIG. 2.
Figure 2B:
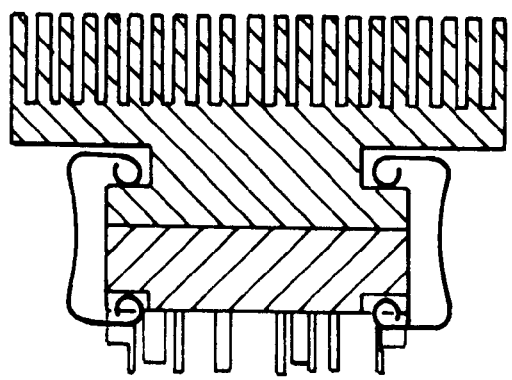

FIG. 2 shows a second embodiment, which is an alternative to the first embodiment shown in FIG. 1. Connection legs (not shown in FIG. 1) are also shown here for the semiconductor module 2, on the side opposite to the bearing side 2a. In contrast to the embodiment shown in FIG. 1, the first spring receptacle 3a of the heat sink 1 is not provided as a groove partly undercutting the bearing area 1a in the heat sink 1. Rather, the sides of the heat sink 1 are perpendicular with regard to the bearing area 1a for the semiconductor module 2. As a result, the spring clips 4 do not have to be hung into the first spring clip receptacle 3a in a manner coming obliquely from below, as according to the first embodiment shown in FIG. 1. Rather, the spring clips 4 can be pushed on laterally from a direction perpendicular to the bearing area provided for the semiconductor module 2. In the case of a second spring clip receptacle 3d of the semiconductor module 2 which is configured in accordance with the first embodiment shown in FIG. 1—according to the invention, this has the advantage of a simplified assembly, as is illustrated in the bottom part of FIG. 2. FIG. 2a shows a first step in which the heat sink 1 is placed by its bearing area 1a onto the bearing side 2a of the semiconductor module 2. After which, in a second step, the two spring clips 4 are inserted by being laterally pushed on into the respective first and second spring clip receptacles 3a, 3d. This produces the assembled state shown in FIG. 2b, which is also shown in the top part of FIG. 2.

In the same way as in accordance with the first embodiment according to the invention, in the second embodiment, thermally conductive paste and/or foil can be introduced between the two contact areas of the heat sink 1 and of the semiconductor module 2. The spring clips 4 are also advantageously configured in such a way that they do not have to be additionally held open as they are pressed.

Figure 3:
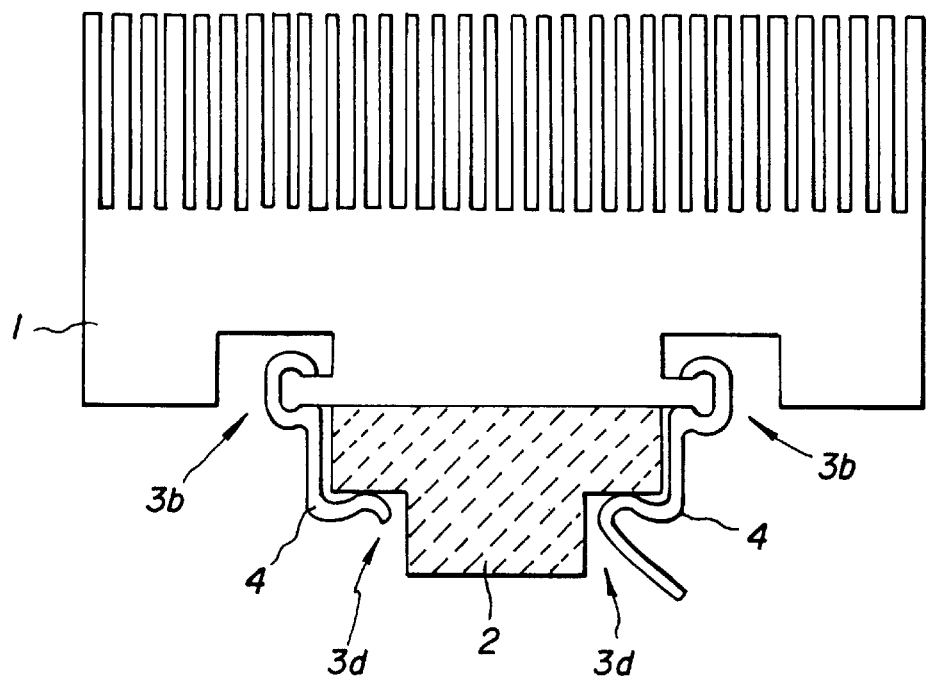
FIG. 3 is a front view of a semiconductor module/heat sink fixing in accordance with a third preferred embodiment of the invention.
Figure 4:
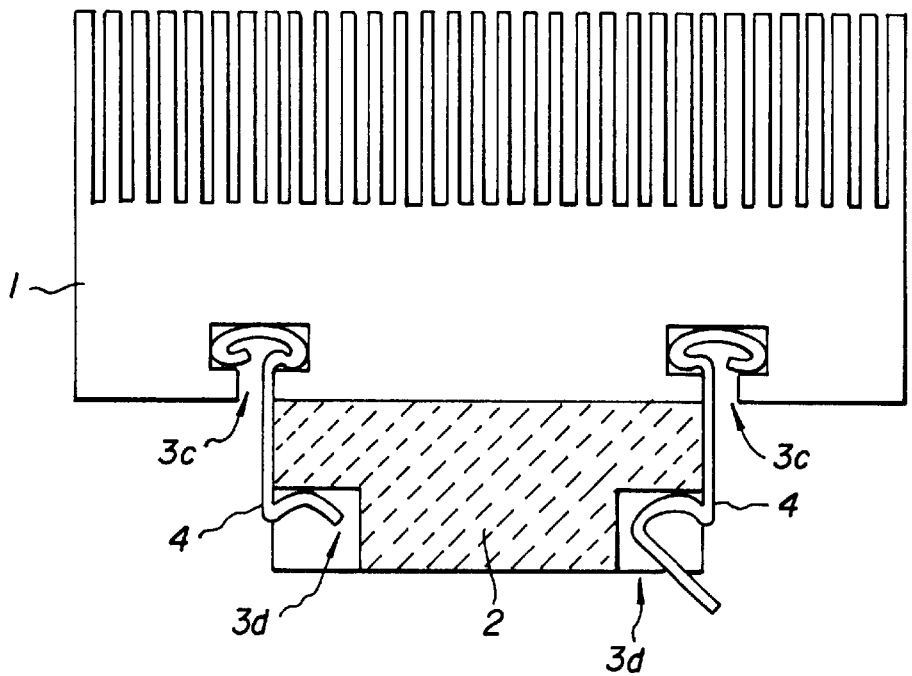
FIG. 4 is a front view of a semiconductor module/heat sink fixing in accordance with a fourth preferred embodiment of the invention.

FIGS. 3 and 4 show two further embodiments of the connection of spring clip 4 and heat sink 1. The clip holds automatically on/in the heat sink 1 and thereby ensuring even simpler handling.

In the third embodiment according to the invention as shown in FIG. 3, in contrast to the embodiments described above, in the case of a first heat sink receptacle 3b of the heat sink 1, a collar is provided over the entire length of said receptacle. This contrasts the first and second embodiments described above. A thickened portion formed in the end region of the collar, a spring clip 4 is inserted and held automatically on the heat sink 1. The functionality and fixing of the semiconductor module 2 to the heat sink 1 correspond to the first embodiment according to the invention. The spring clips 4 can fix the semiconductor module by initially having to be bent apart in order to enable the heat sink 1 to be placed onto the semiconductor module 2. This is the case of a spring clip 4 shown on the left in FIG. 3. Or, the spring clips must be configured in such a way that they bend apart automatically when the heat sink 1 is placed onto the semiconductor module 2, as is the case with a spring clip 4 shown on the right in FIG. 3. After such placement, the spring clips 4, can automatically latch into the second spring clip receptacle 3d of the semiconductor module 2 on account of their configuration. The connection can be made simply by being released or by automatically snapping into place and hold the semiconductor module 2 on the heat sink 1 and pressing it onto the latter.

The fourth embodiment according to the invention differs from the third embodiment merely to the extent that a spring clip 4 can be fixed to the heat sink not at a collar-shaped first spring clip receptacle 3b but at a groove-shaped first spring clip receptacle 3c, in such a way that it automatically holds in the heat sink. For this purpose, the first spring clip receptacle 3c has a groove that is situated in the heat sink 1. The groove widens e.g. in a shoulder-shaped manner into the heat sink 1, so that a correspondingly adapted spring clip 4 can be inserted to hold automatically in the heat sink. The mounting of the heat sink 1 equipped with at least one spring clip 4 onto a semiconductor module is done in accordance with the third embodiment according to the invention as shown in FIG. 3.

The embodiments according to the invention as described above can, of course, be combined with one another, where the various forms of spring clips 4 and/or spring clip receptacles 3a, 3b, 3c, 3d can be combined with one another as desired, so that spring clip receptacles 3b or 3c with a collar or a groove can also be provided on the semiconductor module 2. A spring clip receptacle 3a, 3b, 3c, 3d extends either over a complete side of the heat sink 1 and/or of the semiconductor module 2 or over a partial region thereof.

As an alternative, a respective spring clip 4 also can be produced in one piece with the heat sink 1 or the semiconductor module 2.

The spring clips described above obtain their spring force either from at least one of their end regions latching into a respective spring clip receptacle, as is shown in FIGS. 1, 3 and 4, or from the central region situated in between, as is shown in FIG. 2. The spring force holds the heat sink 1 and the semiconductor module 2 together. As an alternative, other embodiments of spring clips are also conceivable, of course.

Figure 5A:
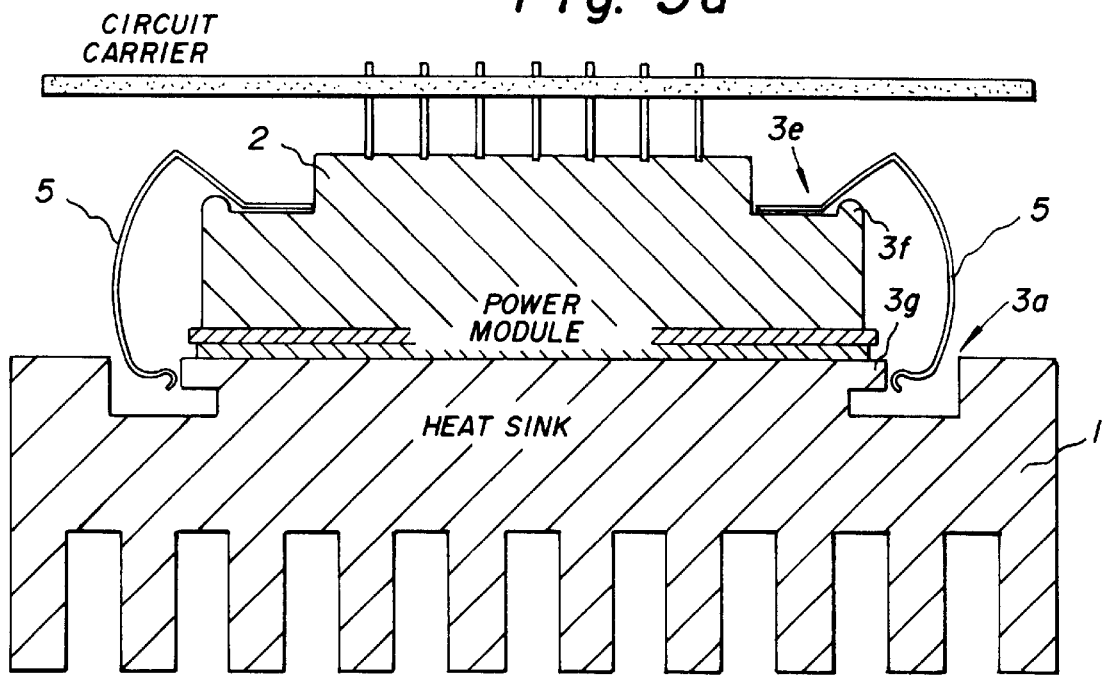
FIG. 5a is a front view of a fifth embodiment semiconductor module/heat sink showing its formation.
Figure 5B:
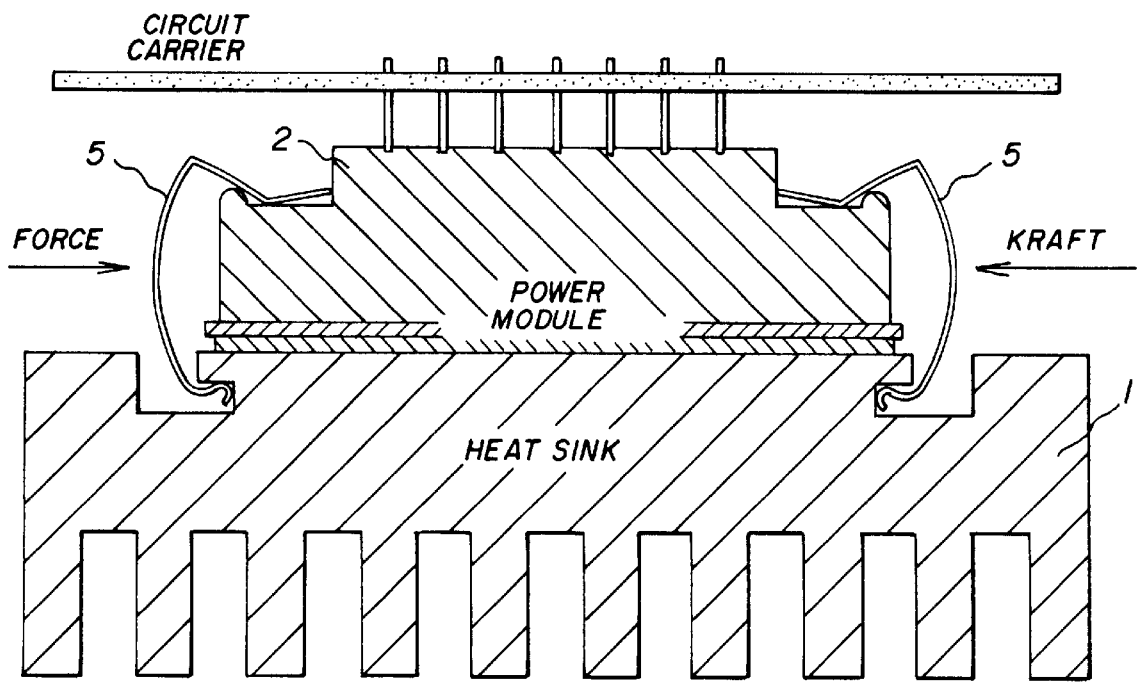
FIG. 5b is a front view of a semiconductor module/heat sink fixing in accordance with the fifth preferred embodiment of the invention.

FIG. 5 shows a fifth embodiment, which is an alternative to the first embodiment shown in FIG. 1. In contrast to the embodiment shown in FIG. 1, the second spring clip receptacle 3d of the semiconductor module 2, which is configured in a step-shaped manner, is configured as a basin-shaped spring clip receptacle 3d. The basin-shaped spring clip receptacle 3d has a curb 3f on the outer edge of the semiconductor module 2. This configuration has the advantage of lateral positioning through the walls of the basin, and of reinforced holding of a spring clip in the spring clip receptacle with the curb 3f both in the relaxed state before the spring clip connects the semiconductor module 2 to the heat sink 1, and in this tensioned or assembled state. The heat sink 1, and in this case in particular the first spring clip receptacle 3a, corresponds to the first embodiment. As an alternative, however, other configurations may also be chosen, e.g. those described for the second to fourth preferred embodiments of the invention.

Figure 6A:
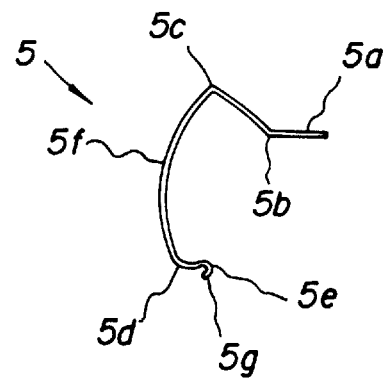
FIG. 6a is a side view of a spring clip that is preferably used in the fifth preferred embodiment according to the invention.

Together with a special embodiment of a spring clip 5 as shown in FIG. 6a, the simplified assembly is produced, as is illustrated in FIG. 5.

Figure 6B:
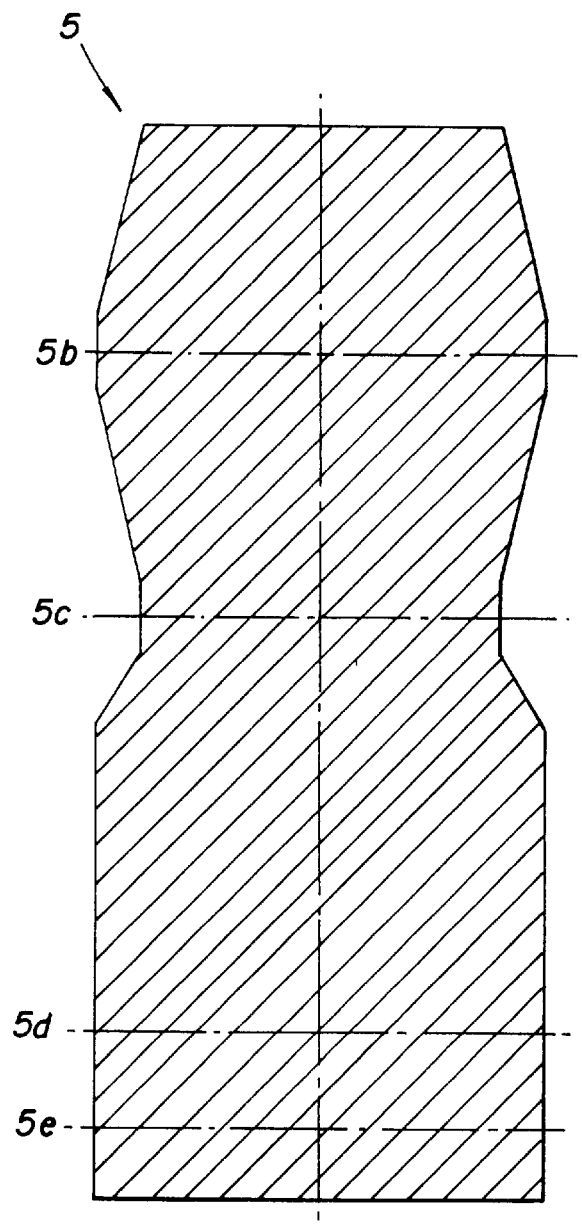

The elastic starting material of the specially configured spring clip 5 is shown in FIG. 6b. The starting material has, in principle, a rectangular form and is converted by a plurality of forming steps into the specially configured spring clip 5 having a smooth end face 5a, four bending edges 5b–5e, a clip arc 5f and a bent end face 5g. The size of the straight end face 5a is adapted to a bearing area—provided therefor—of the basin-shaped spring clip receptacle 3e. The smooth end face 5a is followed by a first bending edge 5b, at which the starting material of the specially configured spring clip 5 is bent upward at an obtuse angle. The angle should be chosen such that the specially configured spring clip 5 bears on the curb 3f of the basin-shaped spring clip receptacle neither in the assembly state, i.e. in the relaxed state before the spring clip connects the semiconductor module 2 to the heat sink 1, nor in the tensioned or assembled state, in this case approximately 140° to 150°. After a section whose length corresponds approximately to that of the smooth end face 5a, the starting material is bent downward at a second bending edge 5c at an angle of approximately 90° in order to effect a transition to the clip arc 5f. The transition has a length adapted to a distance between the basin-shaped spring clip receptacle 3e of the semiconductor module and the step-shaped spring clip receptacle 3a of the heat sink 1. After the clip arc 5f, the starting material is bent upward toward the smooth end face 5a at a third bending edge 5c at an angle of approximately 90°, before terminating with a fourth bending edge 5d with a narrow bend of approximately 180° into a bent end region 5g.

The clip arc 5f is curved outward in the assembled state. The clip arc 5f, forms, together with the section lying between the first bending edge 5b and the second bending edge 5c, the second bending edge 5c and the third bending edge 5d, and a tensioning arc. The tensioning arc tensions the semiconductor module 2 onto the heat sink 1 in the assembled state.

As specified above, the fourth bending edge 5e and also the bent end face 5g are optionally provided, but a possibility for latching the specially configured spring clip 5 into the spring clip receptacle 3a of the heat sink 1 must be ensured.

FIG. 5a shows a first step in which the semiconductor module 2 with a mounted circuit carrier and two inserted, specially configured spring clips 5 is placed by its bearing side 2a onto the bearing area 1a of the heat sink 1 headfirst, i.e. with the circuit carrier pointing upward. In the inserted state, the bent end 5g is opposite a tooth 3g of the respective first spring clip receptacles 3a at a short distance. The distance prevents the specially configured spring clips 5 from touching the first spring clip receptacle 3a of the heat sink 1. Otherwise, this touching could occur during the lowering of the semiconductor module 2 onto the heat sink 1 on account of possible inaccuracies of the assembly apparatus, in order to prevent undesired adjustment of the clip from its starting position. The length of the section of the specially configured spring clip 5 which is situated between the first bending edge 5b and the second bending edge 5c is determined by way of the distance that is required here. After the first assembly step, in a second step, the two specially configured spring clips 5 are latched by their bent end face 5g via the tooth 3g into the respective first spring clip receptacles 3a. The latching is completed by application of a lateral force and a resultant rocking of the specially configured spring clip 5 about its first bending edge 5b, in order to obtain the assembled state shown at the bottom of FIG. 5. In this case, the curb 3f helps to ensure that the specially configured spring clip 5 does not slip out from the basin-shaped spring clip receptacle 3e of the semiconductor module 2, the receptacle normally is provided with a smooth surface.

On account of its form, the specially configured spring clip 5 rocks about the first bending edge 5b upon application of the force. Furthermore, a tensioning arc is produced about the second bending edge 5c and third bending edge 5d with clip arc 5f lying in between. The clamping is effected at the force bending edge 5e together with the bent end piece 5g.

Figure 7A:
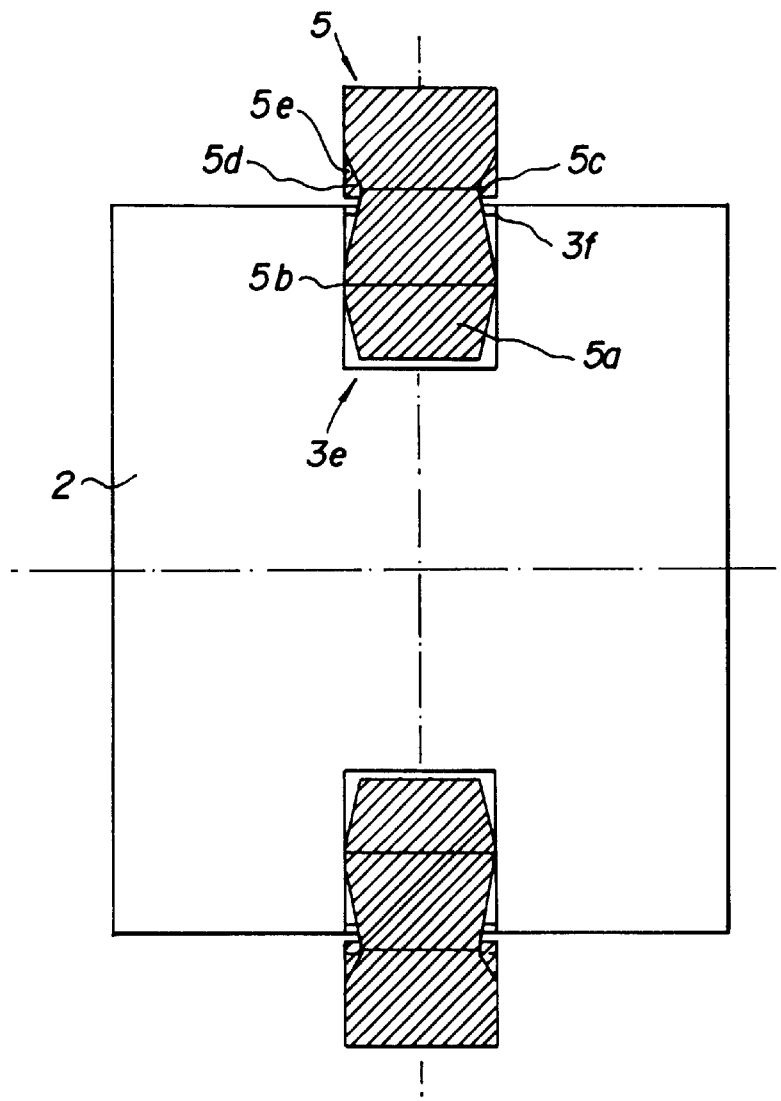
FIG. 7a is a plan view of a housing of a semiconductor module according to the invention.
Figure 7B:
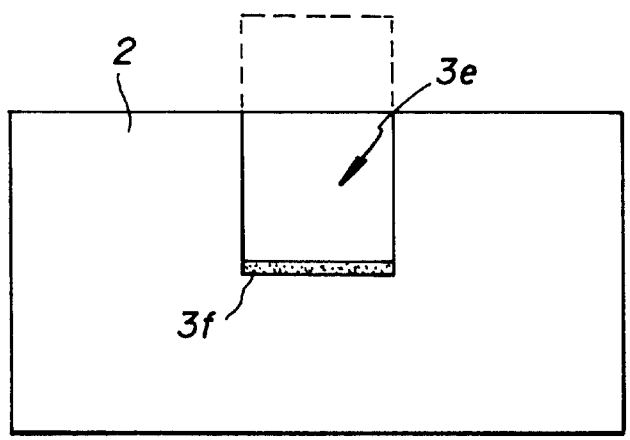

The specially configured spring clip 5 is generally placed into a basin-shaped spring clip receptacle 3e of the semiconductor module 2, as is also shown in FIG. 7a. The basin-shaped spring clip receptacle 3e has walls projecting above the body of the semiconductor module 2, as is shown by broken lines in FIG. 7b. The specially configured spring clip 5 is preferably configured to be narrower around the first bending edge 5b and the second bending edge 5c. As a result, the spring clip obtains fixed retention between the walls and, during the lateral force action, can rock around the first bending edge 5b and take up the tensioning force on the latter.

The clip arc 5f can, of course, also have a form which is curved inward in the assembled state or a smooth form, it being necessary to correspondingly adapt the bending angles at the bending edges.

In the same way as in accordance with the first embodiment according to the invention, in the fifth embodiment it is also possible to introduce thermally conductive paste and/or foil between the two contact areas of the heat sink 1 and of the semiconductor module 2.

The fifth embodiment according to the invention as described above can, of course, also be combined with the other embodiments according to the invention. For example, the various forms of the spring clip receptacles 3a, 3b, 3c, 3d can be combined with one another as desired or to be mutually interchanged with regard to their configuration on the semiconductor module 2 and on the heat sink 1.

We claim:

1. A spring clip for fixing a heat sink having a step-shaped first spring clip receptacle with a tooth to a semiconductor module having a basin-shaped second spring clip receptacle with a bearing area and a curb, comprising:
   a spring clip body, including:
      a smooth end face adapted to the bearing area of the basin-shaped second spring clip receptacle;
      a first bending edge from which said spring clip body bends upward at an obtuse angle with respect to said smooth end face such that said spring clip body does not bear on the curb of the basin-shaped second spring clip receptacle during assembly;
      a section beginning from said first bending edge and having a length corresponding approximately to that of said smooth end face;
      a second bending edge at an end of said section, from which said spring clip body bends downward at an angle of approximately 90°;
      a clip arc bending downward from said second bending edge and having a length adapted to a distance between the basin-shaped second spring clip receptacle of the semiconductor module and the step-shaped first spring clip receptacle of the heat sink; and
      a third bending edge at an end of said clip arc, from which said spring clip body bends upward toward said smooth end face at an angle of approximately 90°.

2. The spring clip of claim 1, further comprising:
   a fourth bending edge from which said spring clip body narrowly bends back at an angle of approximately 180°; and
   a bent end region bending from said fourth bending edge and adapted to the tooth of the step-shaped first spring clip receptacle.

3. The spring clip of claim 1, wherein said obtuse angle is approximately 140° to 150°.

4. The spring clip of claim 1, wherein said clip arc is curved outward in an assembled state.

5. The spring clip of claim 1, wherein said clip arc is curved inward in an assembled state.

6. The spring clip of claim 1, wherein said clip arc is a smooth form in an assembled state.

* * * * *